(12) United States Patent
Kanzawa

(10) Patent No.: US 7,410,897 B2
(45) Date of Patent: Aug. 12, 2008

(54) CONTACT PLUG PROCESSING AND A CONTACT PLUG

(75) Inventor: Hideyuki Kanzawa, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/297,340

(22) Filed: Dec. 9, 2005

(65) Prior Publication Data

US 2006/0091431 A1    May 4, 2006

Related U.S. Application Data

(62) Division of application No. 10/688,873, filed on Oct. 21, 2003, now Pat. No. 7,122,903.

(51) Int. Cl.
*H01L 21/00* (2006.01)
*H01L 21/44* (2006.01)
*H01L 21/302* (2006.01)
*H01L 21/461* (2006.01)

(52) U.S. Cl. .................. 438/637; 438/673; 438/713; 438/73

(58) Field of Classification Search .................. 438/637, 438/706, 40, 43, 73, 640, 673, 701, 713, 438/978
See application file for complete search history.

(56) References Cited

U.S. PATENT DOCUMENTS

| | | | | |
|---|---|---|---|---|
| 4,888,087 A | * | 12/1989 | Moslehi et al. | 438/629 |
| 5,732,009 A | * | 3/1998 | Tadaki et al. | 365/51 |
| 6,649,517 B2 | * | 11/2003 | Teh et al. | 438/640 |

* cited by examiner

*Primary Examiner*—Chuong Anh Luu
(74) *Attorney, Agent, or Firm*—Birch, Stewart, Kolasch & Birch, LLP

(57) ABSTRACT

A semiconductor device has anisotropically formed via holes through a PMD layer. The anisotropic geometry of the via holes results in the diameter of a via hole over a gate structure being equal to the diameter of a via hole not over the gate structure. The via holes are formed by depositing a silicon layer and an antireflective layer over the PMD layer. The silicon layer and the antireflective layer are etched to have holes with a regular taper. The holes through the PMD are anisotropically etched so as to have straight walls.

15 Claims, 4 Drawing Sheets

CONTACT PLUG PROCESSING AND A CONTACT PLUG

CROSS-REFERENCED TO RELATED APPLICATION

This application is a Divisional of application Ser. No. 10/688,873, filed on Oct. 21, 2003, now U.S. Pat. No. 7,122,903 the entire contents of which are hereby incorporated by reference and for which priority is claimed under 35 U.S.C. § 120.

FIELD OF THE INVENTION

The invention relates to a semiconductor device having a contact hole formed by etching in a tapered fashion.

BACKGROUND OF THE INVENTION

The increasing miniaturization of semiconductor devices has greatly reduced the size of contact holes, which are also referred to as via holes. The advent of 0.18 μm semiconductor processing has produced a myriad of problems such as shape defects caused by insufficient margin in the photolithography step. The etching process becomes increasingly difficult due to the reduced thickness of the photoresist that serves as mask material for etching. Changes in contact dimensions result from the variance of the thickness of interlayer insulation films.

The dielectric layer between the active devices in silicon and the first metal layer is termed the premetal dielectric (PMD). The PMD is also termed the first interlayer dielectric (ILD-1). The PMD is typically a doped silicon dioxide, or glass. An important function of the PMD layer is to isolate transistor devices in two ways: electrically from the metal interconnect layer, and physically from contamination sources such as mobile ions. The PMD has a restricted thermal budget in high-performance devices so as to minimize degrading the transistor's characteristics.

The ILD is an insulating material that electrically separates the metal levels in multilevel metallization. Once deposited, the ILD is patterned an etched to form via pathways for the various metal layers and the silicon. The via holes, also called contact holes, are filled with a metal, conventionally tungsten (W), to form the via hole plug. There are many via holes on a wafer, up to $10^{11}$ vias on each individual layer of a 300 mm product wafer. This process of creating via holes in the ILD is repeated for every ILD layer, including the PMD. In conventional metallization, a blanket layer of aluminum alloy metal is deposited on the dielectric layer, patterned and then etched to form metal lines. The metal etch is an important technology in conventional metallization.

FIG. 7 shows a semiconductor device having a via hole manufactured according to the conventional art. In FIG. 7, a transistor has a silicon substrate 1 and a field area 2 that divides one transistor from another. Over the substrate a transistor gate 3 is formed. Over the transistor gate a silicon nitride ($Si_3N_4$) passivation layer 4 is formed. Alternatively, silicon oxynitride can be used to form a passivation layer. Over the silicon nitride passivation layer is deposited the BPSC (borophsophosilicate glass) or PMD (premetal dielectric). The materials that can be used for the PMD include FSG (silicon oxyfluoride), HSQ (hydrogen silsesquioxane), nanoporous silica, PAE (polyarylene ether), FLAC (fluorinated amorphous carbon) or AF4 (aliphatic tetrafluorinated poly-p-xylylene).

In the conventional art of FIG. 7, an antireflective coating (ARC) 7 is provided directly on top of the PMD layer 5. Over the ARC 7 is formed a layer of photoresist 8 having openings over the portions where the via holes are to be formed. In the conventional art, a problem arises from the different lengths of the via holes, the via hole over the gate being shorter than the via hole over the source or drain. It is desirable that the via holes be cut straight. However, in the conventional art the photoresist has a wide opening over the via hole and the resulting via hole is tapered. As a result, the diameter $l_1$ of the via hole over the gate and the diameter of the via hole $l_2$ that is not over the gate is not equal so that $l_1 \neq l_2$.

Additional disadvantages associated with the conventional art are that the ARC layer is not completely opaque, and at least some light can penetrate through the ARC. When the phase of the incoming light wave and the phase of the reflective light wave are the same, the intensity of the light equals the sum of the intensities of both the incoming and reflective light. If the phase differs by 180 degrees, then the light cancels each other to cause extinction. The phase can be adjusted by adjusting the thickness of the layer, so that the incoming and reflected light cancel each other.

The difficulty associated with adjusting the ARC layer arises from the subsequent requirement to etch the nitride layer. However, both the ARC and the nitride layer have similar etch characteristics, which means that they both etch at the same speed. As a result, the nitride layer does not act as a mask and the thickness of the ARC layer is difficult to control using the conventional technology.

Additional disadvantages of the conventional technology are associated with the treatment subsequent to opening the via holes. After opening the via hole, Ti and TiN are sputtered to reduce resistance at the contact. Afterwards, the contact hole is filled with tungsten. During the sputtering, Ti and TiN overhang the via hole. This occurs because the sputtering process causes the Ti and TiN to approach the via hole at an angle. As a result, Ti and TiN overhang the via hole to narrow the opening of the via hole. This overhang prevents the tungsten from properly filling the via hole. To prevent this improper filling, the opening can be tapered, but this taper would then result in the associated problem of the diameter of the via hole over the gate being different than the diameter of the via hole not over the gate. Therefore, tapering the via hole does not provide an ideal solution to reduce the disadvantages caused by the Ti and TiN overhang.

SUMMARY OF THE INVENTION

The invention, in part, provides a method for fabricating a semiconductor device that substantially eliminates one or more of the problems due to limitations and disadvantages of the related art.

The invention, in part, provides a method of creating a contact for a semiconductor device that entails depositing a PMD layer on the semiconductor device, depositing a silicon layer and an antireflection layer over the PMD layer, etching the silicon and antireflection layers in a tapered fashion, etching a via hole in the PMD layer in a non-tapered fashion, and forming the contact in the etched via hole. The via holes can be lined with Ti/TiN. The via holes can be filled with tungsten, or the via holes can be lined with Ta/TaN and filled with copper. The contacts are formed from a metal that can be at least one of tungsten, copper, and copper alloy.

The invention, in part, pertains to a semiconductor device that has a substrate, at least one gate over the substrate, a PMD layer over the gate and the substrate, at least one via hole over the gate, and at least one via hole not over the gate, so that the via hole over the gate is not tapered and the via hole not over the gate is not tapered.

The invention, in part, pertains to the via hole over the gate and the via hole not over the gate both have the same diameter.

The invention, in part, pertains to via holes anisotropically formed through a PMD layer so that the via holes have parallel walls.

The invention, in part, pertains to a semiconductor device having via holes formed by depositing a silicon layer over the PMD layer, depositing an antireflective layer over the PMD layer, etching a tapered hole through the antireflective layer and the silicon layer, and anisotropically etching the PMD layer.

Advantages of the present invention will become more apparent from the detailed description given herein after. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The accompanying drawings are included to provide a further understanding of the invention. The drawings illustrate embodiments of the invention and together with the description serve to explain the principles of the embodiments of the invention.

DETAILED DESCRIPTION

Advantages of the present invention will become more apparent from the detailed description given herein after. However, it should be understood that the detailed description and specific examples, while indicating preferred embodiments of the invention, are given by way of illustration only, since various changes and modifications within the spirit and scope of the invention will become apparent to those skilled in the art from this detailed description.

In order to solve the above-described problems associated with the conventional art, the invention, in part, deposits either amorphous silicon or polysilicon as a mask material and an organic or inorganic ARC after completing the formation of a gate electrode, SiN passivation layer deposition, interlayer film deposition, and flattening using CMP (chemical mechanical polishing).

By utilizing the two layers (silicon and ARC), the invention makes it possible to completely ignore dimensional changes caused by thickness variations of the films between base layers. Also, in order to improve the photo-process margin, a regular taper was applied to the etching of interlayer films, and the resist pattern was made larger than the bottom diameter after contact formation. This alleviates such problems as the worsened dimensional variance caused by differences in the thickness of interlayer films on the active region, gate and other wafer surfaces. The invention minimizes short circuits between connection lines and other metal conductors formed on the upper part of the contact caused by an increase in the diameter of the opening in the upper part of the contact.

Figure 1:
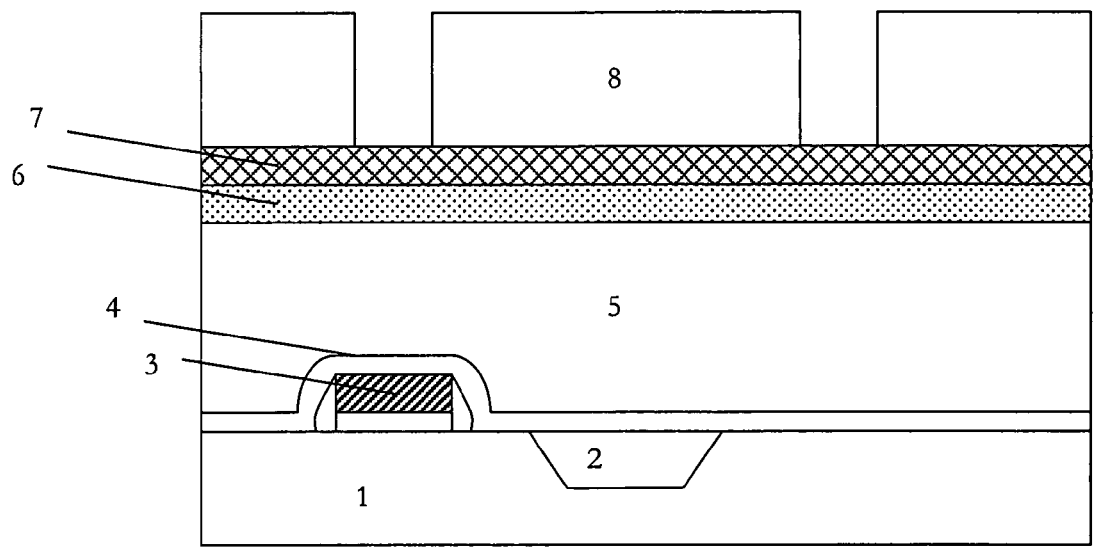
FIG. 1 is a diagram of a process to form a semiconductor via hole according to the invention.

FIG. 1 is a diagram of a process to form a semiconductor via hole according to the invention. A silicon substrate 1 has a field oxide film 2 formed in accordance with the conventional art. Gate electrode 3 is formed over the silicon substrate 1. A passivation layer 4 made of silicon nitride or silicon oxynitride is formed over the substrate 1, oxide film and gate 3. Above the passsivation layer 4 is deposed a PMD (also called ILD-1) layer 5. Over the PMD layer is first deposed a silicon layer 6 that can comprise either amorphous silicon or polycrystalline silicon. Over the silicon layer 6 is deposed an organic or inorganic ARC layer 7. Over the ARC layer 7, a photoresist layer 8 is formed having spaces over the portions where the via holes are to be formed.

The field oxide film 2 serves as an isolation barrier between individual transistors to isolate them from each other. Common field oxide film thickness ranges from about 2,500 Å to about 15,000 Å.

The gate electrode 3 can be formed by depositing a Poly-Si or a —Si or WSi on a $SiO_2$ or SiN film using a method such as CVD, and patterning the gate electrode 3 using photolithography and etching technology to form the gate electrode structure 3. The thickness of $SiO_2$ and SiN are less than 15 nm. The thicknesses of Poly-Si, a-Si, and WSi are from 100 nm to 300 nm. The SiN is typically formed using LPCVD using a reaction of ammonia and dichlorosilane gas at a temperature of about 750° C. or PCVD using a reaction of $SiH_4$ and $NH_3$ gas at a temperature of about 400° C.

The PMD 5 is deposited across the surface of the wafer using CVD, for example. The PMD is typically silicon dioxide, doped silicon dioxide or glass. The PMD can be borosilicate glass, PSG (phospohosilicate glass), BPSG (borophosphosilicate glass), or FSG (fluorosilicate glass, also call silicon oxyfluoride). Other materials suitable for the PMD HSQ (hydrogen silsesquioxane), nanoporous silica, PAE (polyarylene ether), FLAC (fluorinated amorphous carbon) or AF4 (aliphatic tetrafluorinated poly-p-xylylene).

The silicon layer 6 can be either amorphous silicon and polycrystalline silicon (polysilicon). The polysilicon can be deposed, for example, using silane gas in a LPCVD (low pressure chemical vapor deposition) furnace.

The ARC layer 7 reduces standing wave effects in the photoresist by applying an antireflective layer that suppresses unintended light reflection. The ARC layer 7 can include but are not restricted to $SiO_2$, $Ta_2O_5$, PMMA (polymethyl methacrylate) and polycarbonate. Water soluble polymers are frequently used to form ARCs. The ARC layer 7 can include, but are not restricted to, SiON, C, and organic ARC of ARS (Shipley Inc.).

The photoresist layer 8 can be a positive or negative photoresist. The positive photoresist can be, for example, a phenol-formaldehyde resin, also referred to as novolak. The photoresist can contain a sensitizer such as diazonaphthoquinone. The photoresist can be, for example, a chemically amplified photoresist containing an acid generator. The photoresist can be a DUV (deep ultraviolet) photoresist based on, for example, tert-butoxycarbonyl, polyhydroxy styrene, phenolic resin, or PMMA (polymethyl methacrylate). The photoresist can be diluted with a solvent such as EGMEA (ethyleneglycol monomethylether acetate) or PGMEA (propyleneglycol monomethylether acetate).

Figure 2:
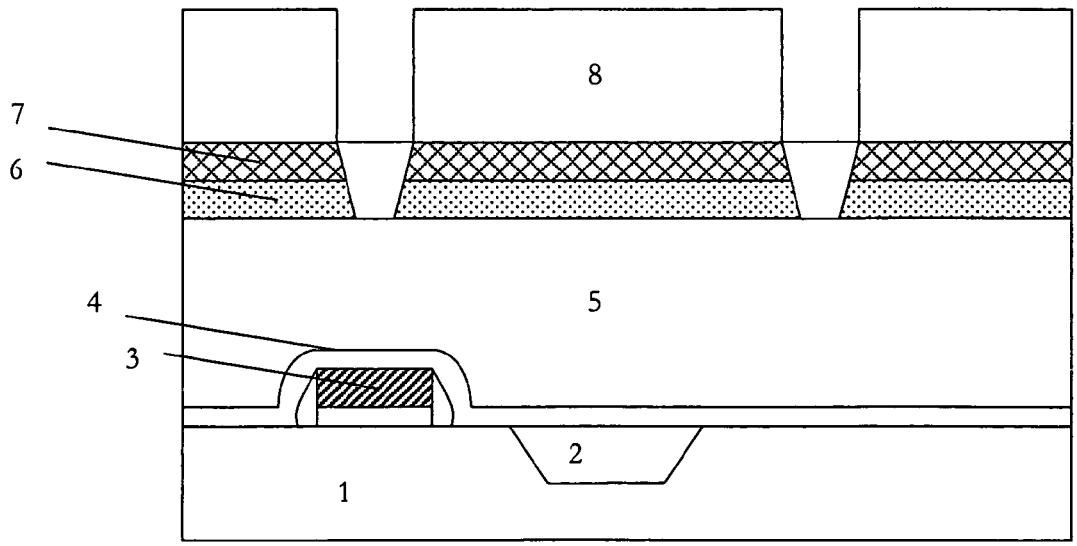
FIG. 2 shows the initial stage of the etch process to form the via hole.

FIG. 2 shows the initial stage of the etch process to form the via holes. A simple, regular taper is etched through the ARC layer 7 and the silicon layer 6. Typically $Cl_2$, HBr and $O_2$ gas are used to make taper profile, and the gas flow ratio is 1:3 to 5:0.1 and pressure is about 10 mm Torr. Adjusting HBr flow ratio can control the taper angle.

Figure 3:
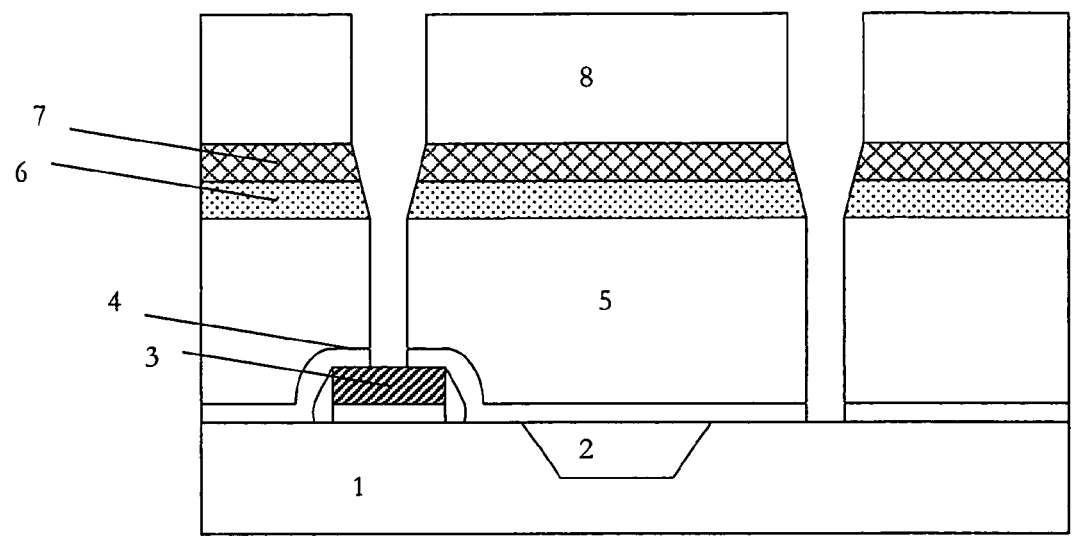
FIG. 3 shows the anisotropic etch through the PMD layer.

FIG. 3 shows the subsequent anisotropic etch through the PMD layer 5 and the passivation layer 4. The etch through the PMD layer 5 and the passivation layer 5 is performed so as to form a via hole having vertical walls as it passes through these layers. Typically $C_5F_8$, CO, $O_2$ and Ar gas are used to make a non taper profile of PMD layer 5, and the gas flow is 1:3:2:20 and pressure is about 15 mm Torr. The $O_2$ gas flow ratio can control the taper angle. Then $CH_2F_2$, Ar and $O_2$ gas are used to etch layer 4, and the gas flow is 1:10:1 and pressure is about 50 mm Torr.

Figure 4:
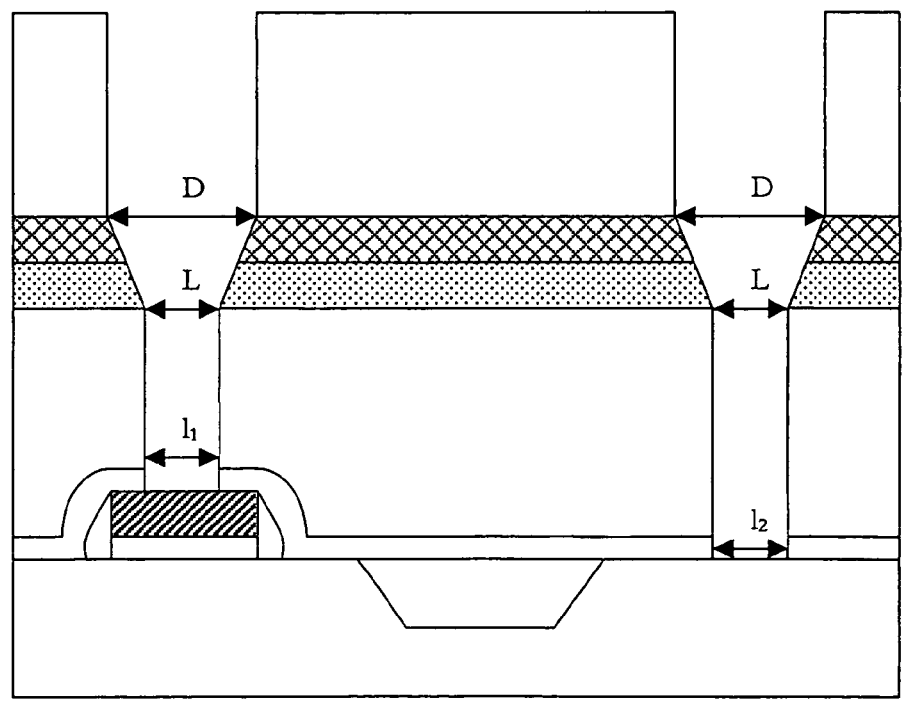
FIG. 4 shows a structural detail of FIG. 3 highlighting the geometry of the via hole formation.

FIG. 4 shows a structural detail of FIG. 3 highlighting the geometry of the via hole formation. The diameter of the via hole at the top surface of the ARC is designated by D, and the diameter of the via hole at the top of the PMD is designated by L. The diameter of the bottom of the via hole at the gate is designated by $l_1$. The diameter of the via hole that does not connect to the gate (that is, the via hole that extends to the substrate) is designated by $l_2$. In the embodiment of the invention shown in FIG. 4, the diameter of the via hole at the top surface of the ARC, D, is greater than the diameter of the via hole at the top of the PMD, L, or D>L. The anisotropic etch through the PMD gives the via hole through the PMD vertical, untapered walls such that the via hole over the gate has $L=l_1$. Similarly, the via hole not over the gate has vertical, untapered wall such that $L=l_2$. As a result, the uniform wall geometry of the device gives $L=l_1=l_2$. That is, the walls of the via holes through the PMD are parallel to each other.

Figure 5:
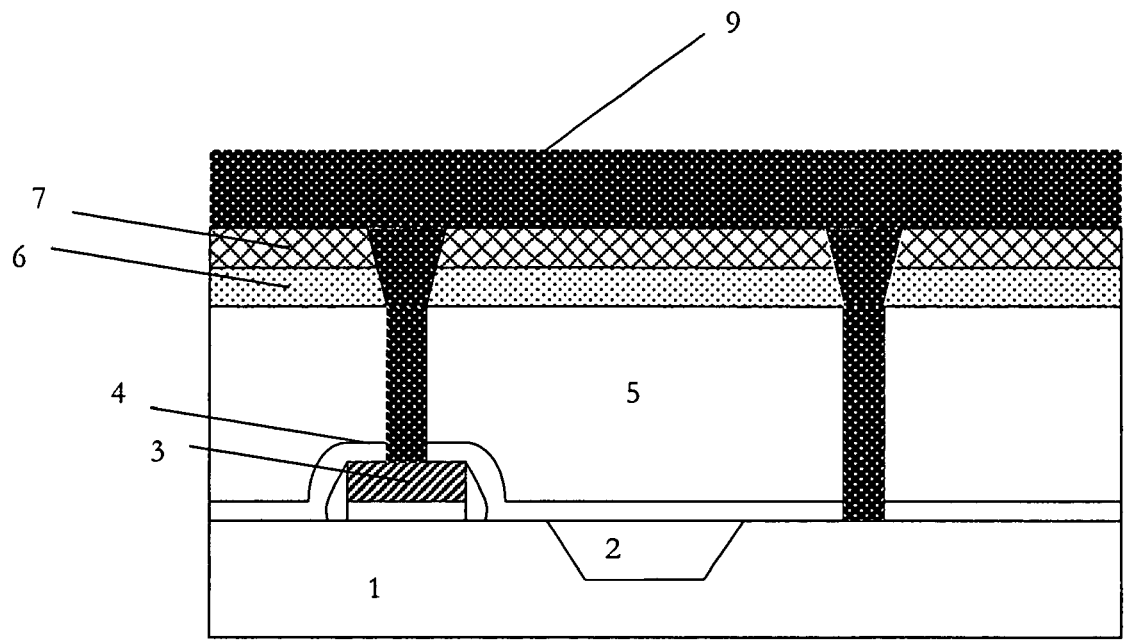
FIG. 5 shows the application of the metal to the semiconductor.

After the via holes are formed, the via holes are filled with a metal 9, as is shown in FIG. 5. The metal can be, but is not restricted to, tungsten, copper, and copper alloys. Copper is preferred for the 0.08 μm and more advanced technologies. In the via hole, a barrier metal such as Ti/TiN or Ta/TaN may be used.

As has been shown, the method for fabricating a semiconductor device according to the invention has the many advantages. The metal fill 9 can be applied using a number of methods such as electrochemical deposition.

Figure 6:
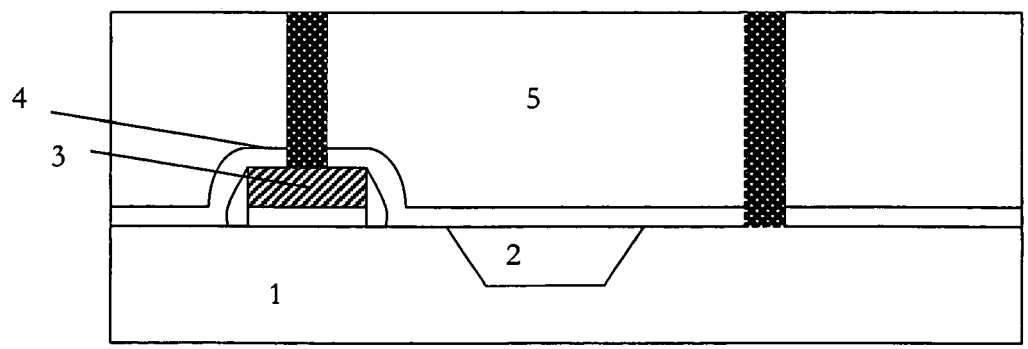
FIG. 6 shows the process following application of the metal fill.
Figure 7:
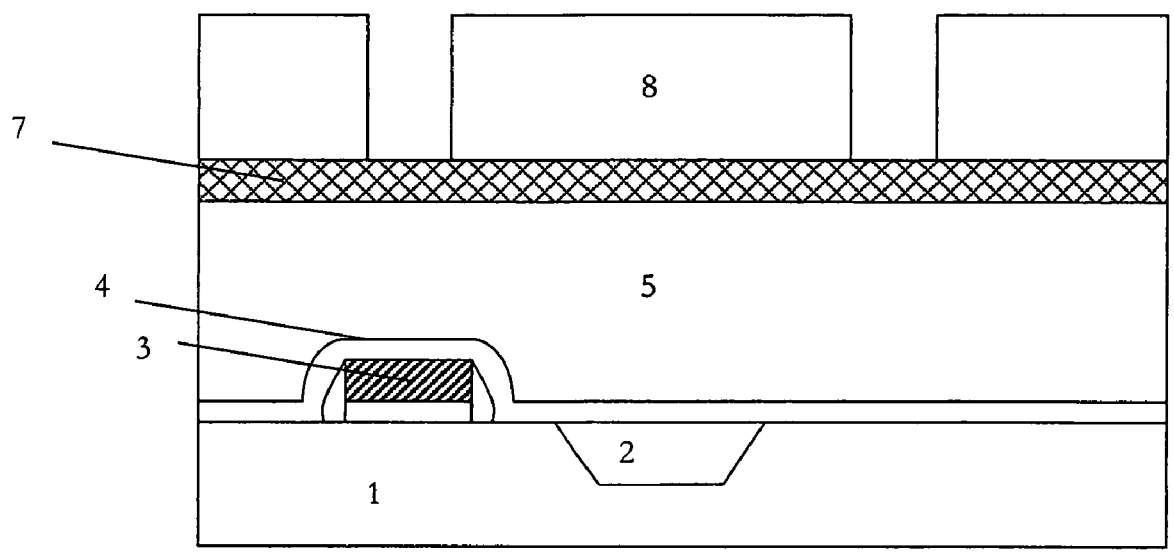
FIG. 7 shows a conventional art via hole technology.

FIG. 6 shows the process following application of the metal fill 9. The metal fill 9, the ARC 8 and the silicon layer 7 are removed in a damascene process using CMP (chemical mechanical planarization). This planarizes the surface and prepares for the next level of ILD. The resulting surface has a planar geometry with metal inlays in the PMD to form the circuitry.

The advantages of the invention include the ability to form an ARC layer whose thickness can be easily adjusted. As a result the light can be canceled so as not to affect the PMD layer. This advantage is especially critical such light sources as a krypton laser ($\lambda$=248 nm) or an argon fluoride laser ($\lambda$=193 nm) is used.

The anisotropic profile of the via holes made according to the invention is highly advantageous. Sputtered materials do not overhang the via hole to interfere with semiconductor processing, such as is observed with tapered via hole geometries. The invention additionally minimizes disadvantages arising from the changes in film thicknesses of the layers. This improved dimensional variance signifies a marked improvement over the conventional art.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. It is to be understood that the foregoing descriptions and specific embodiments shown herein are merely illustrative of the best mode of the invention and the principles thereof, which is therefore understood to be limited only by the scope of the appended claims.

What is claimed is:

1. A method of creating a contact for a semiconductor device comprising:
    depositing a PMD layer over the semiconductor device;
    depositing a silicon layer over the PMD layer;
    depositing an antireflection layer over the silicon layer;
    etching the silicon and antireflection layers in a tapered fashion;
    etching at least one via hole in the PMD layer in a non-tapered fashion; and
    forming the contact in the etched via hole.

2. The method of claim 1, wherein the contact is formed by filling the via hole with at least one metal selected from the group consisting of tungsten, copper and copper alloy.

3. The method of claim 1, wherein the diameters of the via hole at each end in opposite surfaces of the PMD layer are nearly equal.

4. The method of claim 2, wherein the contact is formed by lining the via hole with a Ti/TiN layer; and
    filling the via hole with tungsten or lining the via hole with a Ta/TaN layer and filling the via hole with copper.

5. The method of claim 1, wherein the silicon layer is deposited on the PMD layer, and the antireflection layer is deposited on the silicon layer.

6. The method of claim 1, wherein the silicon layer is polycrystalline silicon.

7. The method of claim 1, wherein the silicon layer is amorphous silicon.

8. The method of claim 1, wherein a plurality of contacts are formed in the semiconductor device, each contact being formed in a separately etched via hole.

9. The method of claim 1, further comprising:
    removing the silicon and antireflection layers.

10. The method of claim 1, wherein a diameter of a via hole of said at least one via hole formed over a gate structure is equal to a diameter of another via hole of said at least one via hole not formed over the gate structure.

11. The method of claim 1, wherein the contact is formed by depositing a metal layer on the etched silicon and antireflection layers, thereby filling the via hole with metal.

12. The method of claim 8, wherein the contact is formed by depositing a tungsten layer on the etched silicon and antireflection layers, thereby filling the via holes with tungsten.

13. A method of creating a contact for a semiconductor device comprising:
    depositing a PMD layer over the semiconductor device;
    depositing a silicon layer over the PMD layer;
    depositing an antireflection layer over the silicon layer;
    etching the silicon and antireflection layers in a tapered fashion to form at least one tapered hole;
    etching at least one via hole in the PMD layer in a non-tapered fashion, each via hole starting at the location of an end of a respective tapered hole; and
    forming the contact in the etched via hole.

14. The method of claim 1, wherein said etching at least one via hole in the PMD layer comprises anisotropically etching at least one via hole in the PMD layer.

15. A method of creating a contact for a semiconductor device comprising:
   depositing a PMD layer over the semiconductor device;
   depositing a silicon layer over the PMD layer;
   depositing an antireflection layer over the silicon layer;
   etching the silicon and antireflection layers in a tapered fashion;
   provided the etched antireflection layer, etching at least one via hole in the PMD layer in a non-tapered fashion; and
   forming the contact in the etched via hole.

* * * * *